(12) United States Patent
Gely et al.

(10) Patent No.: US 8,710,574 B2
(45) Date of Patent: Apr. 29, 2014

(54) DUAL GATE ELECTRONIC MEMORY CELL AND DEVICE WITH DUAL GATE ELECTRONIC MEMORY CELLS

(75) Inventors: Marc Gely, Meylan (FR); Gabriel Molas, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/308,886

(22) Filed: Dec. 1, 2011

(65) Prior Publication Data

US 2012/0139025 A1 Jun. 7, 2012

(30) Foreign Application Priority Data

Dec. 2, 2010 (FR) .................................... 10 60023

(51) Int. Cl.
*H01L 29/788* (2006.01)
*H01L 21/28* (2006.01)
*H01L 27/115* (2006.01)

(52) U.S. Cl.
CPC .... *H01L 21/28282* (2013.01); *H01L 27/11568* (2013.01)
USPC ............................... 257/316; 438/257

(58) Field of Classification Search
CPC .................... H01L 21/28282; H01L 27/11568
USPC ........................................................ 257/316
See application file for complete search history.

(56) References Cited

U.S. PATENT DOCUMENTS

| 5,768,192 | A | 6/1998 | Eitan |
|---|---|---|---|
| 7,130,223 | B2 | 10/2006 | Ishimaru et al. |
| 2004/0207025 | A1 | 10/2004 | Chiba et al. |
| 2008/0144394 | A1 | 6/2008 | Ando |
| 2009/0224306 | A1 | 9/2009 | Hayashi |
| 2010/0200909 | A1* | 8/2010 | Kawashima et al. ......... 257/326 |
| 2011/0169067 | A1 | 7/2011 | Ernst et al. |
| 2011/0300699 | A1 | 12/2011 | Molas et al. |

OTHER PUBLICATIONS

U.S. Appl. No. 13/736,578, filed Jan. 8, 2013, Charpin-Nicolle.
U.S. Appl. No. 13/736,524, filed Jan. 8, 2013, Charpin-Nicolle, et al.
Preliminary Search Report issued Aug. 1, 2011 in France Application No. 1060023 (With English Translation of Category of Documents).

(Continued)

*Primary Examiner* — Thao Le
*Assistant Examiner* — Laura Dykes
(74) *Attorney, Agent, or Firm* — Oblon, Spivak, McClelland, Maier & Neustadt, L.L.P.

(57) ABSTRACT

A memory cell including:

an active area having a channel provided between a source and a drain, a first gate provided on a first part of the channel, a portion of a first lateral spacer provided against a lateral flank of the first gate, a part of which forms a second gate provided on a second part of the channel, one of two gates forming a storing gate, the memory cell further including a portion of a second lateral spacer provided against a lateral flank of a block provided on the semi-conductor layer, the second lateral spacer being in contact with the first lateral spacer, the first and second lateral spacers being composed of similar materials, said portion of the second lateral spacer forming a part of an electrical contact pad electrically connected to the second gate.

14 Claims, 13 Drawing Sheets

(56) References Cited

OTHER PUBLICATIONS

Walter Stefanutti, et al., "Monte Carlo Simulation of Substrate Enhanced Electron Injection in Split-Gate Memory Cells", IEEE Transactions on Electron Devices, vol. 53, No. 1, Jan. 2006, pp. 89-96.

Sohrab Kianian, et al., "A Novel 3 Volts-Only, Small Sector Erase, High Density Flash $E^2PROM$", 1994 Symposium on VLSI Technology Digest of Technical Papers, 1994, 2 pages.

Toshihiro Tanaka, et al., "A 512kB MONOS type Flash Memory Module Embedded in a Microcontroller", 2003 Symposium on VLSI Circuits Digest of Technical Papers, 2003, 2 pages.

* cited by examiner

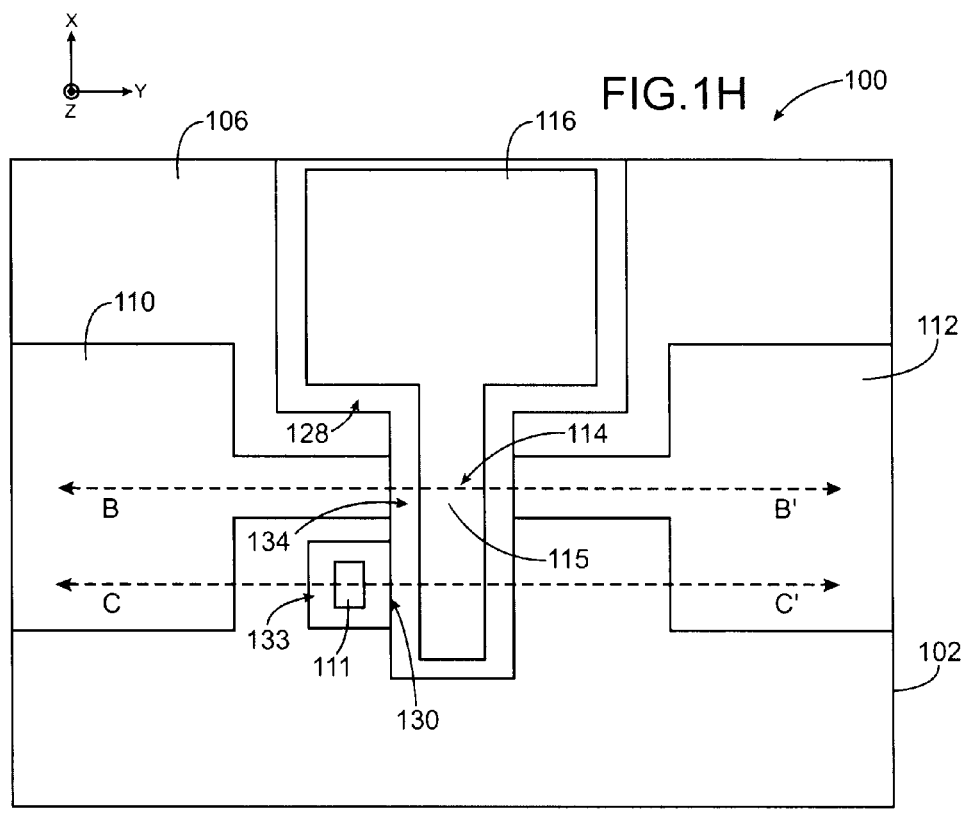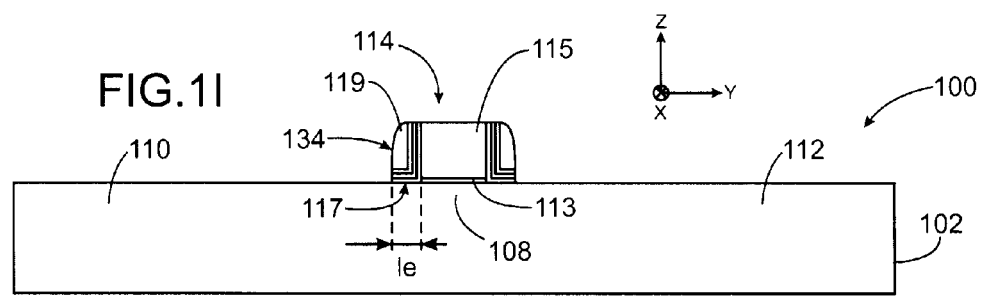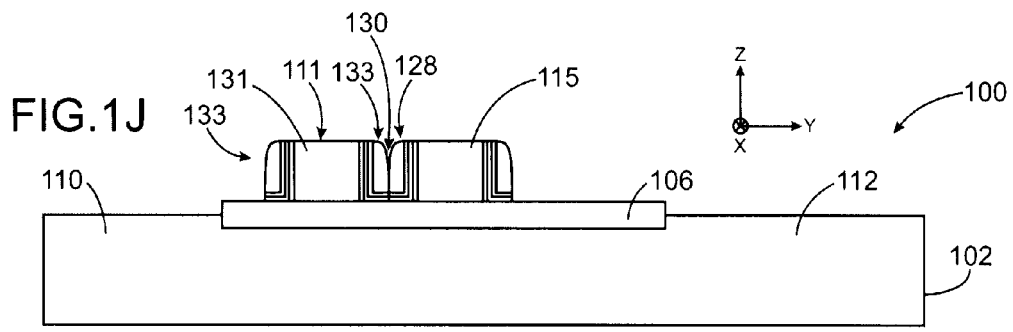

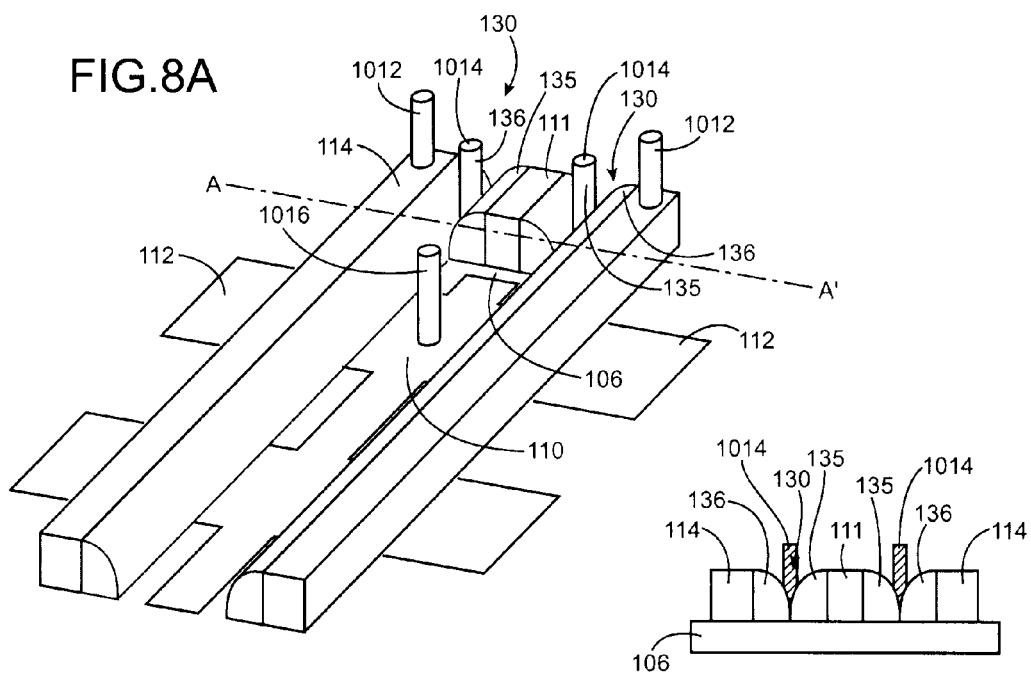
FIG.8A
FIG.8B
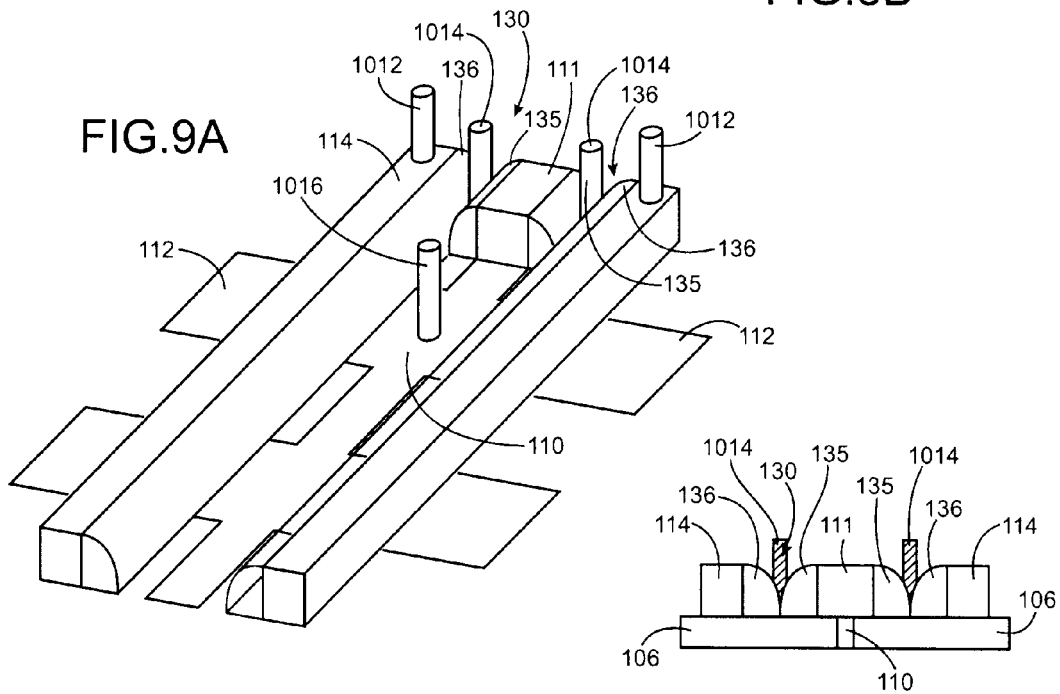
FIG.9A
FIG.9B

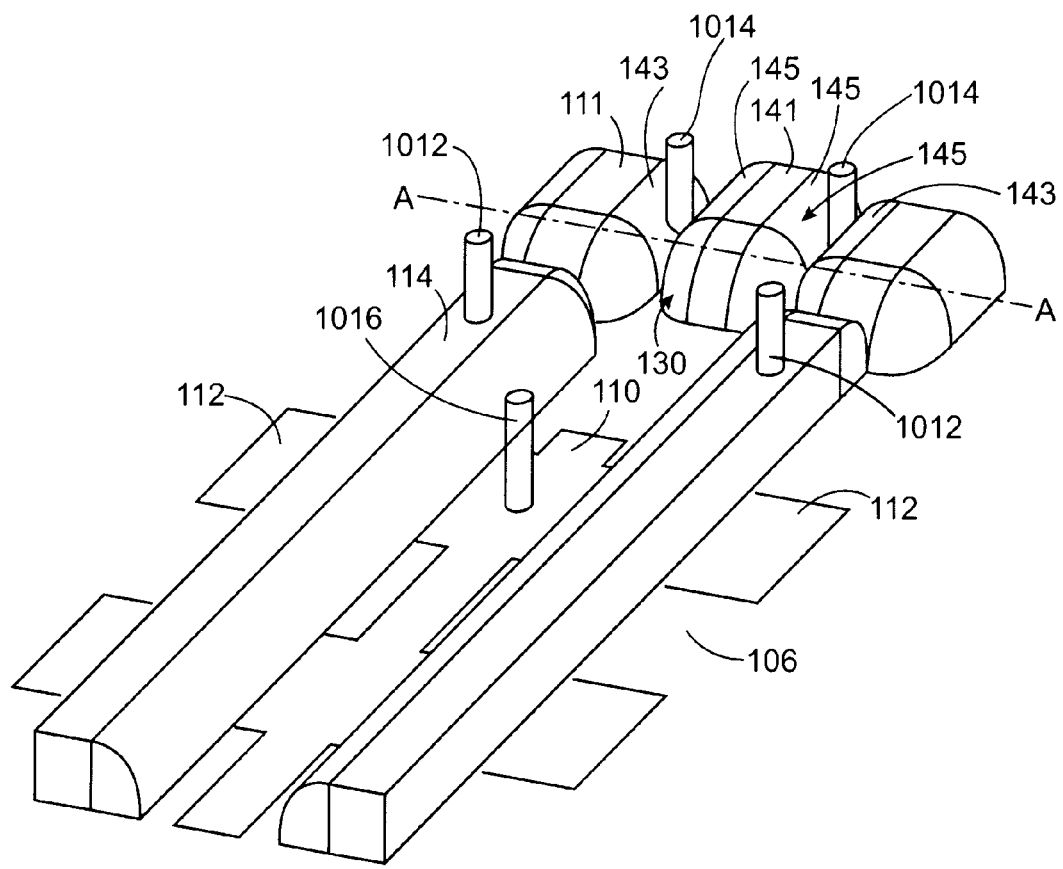
FIG.12A
FIG.12B
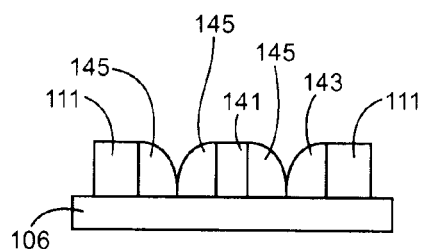

DUAL GATE ELECTRONIC MEMORY CELL AND DEVICE WITH DUAL GATE ELECTRONIC MEMORY CELLS

TECHNICAL FIELD

This invention relates to the field of non-volatile electronic memory devices, or memories, and more particularly the field of dual gate (floating gate for storage and control gate) Flash type electronic memories.

STATE OF PRIOR ART

There are several types of non-volatile memories, that is memories preserving stored information in the absence of power supply, that can be electrically written and/or erased:

EPROMs ("Erasable Programmable Read Only Memories"), the content of which can be electrically written, but which can be subjected to UV radiation to erase the stored information, EEPROMs ("Electrically Erasable Programmable ROMs") the content of which can be electrically written and erased, but which require, for manufacture thereof, higher semi-conductor areas than EPROM type memories, and which thus are more costly to make.

There are also non-volatile memories, called Flash memories, which do not have the drawbacks of the abovementioned EPROMs or EEPROMs memories. Indeed, a Flash memory is formed by a plurality of memory cells that can be singly electrically programmed, and a great number of cells, called a block, sector or page, that can be simultaneously and electrically erased. Flash memories combine both the advantage of EPROMs memories in terms of integration density and the advantage of EEPROMs memories in terms of electrical erasing.

Moreover, the durability and low power consumption of Flash memories make them interesting for numerous applications: digital cameras, cellular phones, printers, personal assistants, laptop computers or even portable sound recording and reading devices, USB keys, etc. Moreover, Flash memories do not have mechanical elements, which provides them with a rather high impact strength.

Most Flash memories are of the stand-alone type and have great storage capacities, generally higher than 1 Gb, and are dedicated to mass storing applications.

However, there are also so-called embedded Flash memories the manufacture of which is integrated in a CMOS type method and which provide a growing interest, for example in the automotive or microcontroller fields, for storing data or codes. Such embedded Flash memories are made on a chip which also includes CMOS devices for providing logical functions different from a data storage. Such embedded Flash memories are generally made for lower storage capacities than that of stand-alone type memories, their capacities generally ranging from a few bits to a few Mb. Desired characteristics of embedded Flash memories are a low manufacturing cost, an excellent reliability (in particular at high temperature), a low power consumption or even a high programming rate, such characteristics depending on the application they are intended for.

Most Flash memories include MOS transistor type structure (gate, source, drain and channel) including a site for storing electrical charges, called floating gate, formed for example by a polysilicon layer provided between two oxide layers, and provided between the electrically conducting material of the gate and the transistor channel. A storage is made by applying to the conducting material a voltage higher than the threshold voltage, for example between 15 V and 20 V, which codes the information to be stored and which depends on the charge trapped in the floating gate.

However, such memories have drawbacks restricting the reduction of their sizes. Indeed, a reduction of the thickness of the tunnel oxide (oxide provided between the channel and the polysilicon layer) results in an increase of SILC ("Stress Induced Leakage Current"). On the other hand, sustained use of such a memory (repeated writing-erasing cycles) generates defects in the tunnel oxide which will assist charge conduction and degrade charge retention in the floating gate, which is an issue in the case of a high SILC. In practice, it is thus difficult to reduce the thickness of the tunnel oxide of these memories to less than 8 nm without SILC becoming a critical phenomenon for storage. Moreover, by reducing the dimensions of such a memory cell, cross-coupling between floating gates of two adjacent cells of a same memory becomes significant and can thus degrade the memory reliability.

For these reasons, MONOS (metal oxide nitride oxide silicon) type memories also called NROM memories, have been proposed to replace the polysilicon floating gate memories. U.S. Pat. No. 5,768,192 describes such memories wherein electrical charges are stored in traps formed in a floating grid made of nitride and provided between two oxide layers. In such a nitride layer, traps are isolated from each other. Thus, an electron stored in one of the traps remains physically localized in this trap, which make these memories much more "resistant" to defects in the tunnel oxide, and thus less impacted by an increase in SILC. Indeed, in the presence of a defect in the tunnel oxide, the storage layer, that is the nitride layer, only loses electrons located in close proximity with a defect, the other trapped electrons being not affected by this defect. These memories are thus provided with a better reliability. Therefore, it is possible to have a tunnel oxide with a thickness lower than about 8 nm, and thus to reduce the required programming voltages. Furthermore, because of the low nitride thickness to form the storage layer, coupling between two adjacent memory cells is strongly reduced with respect to polysilicon floating gate cells. Finally, the structure of the NROM type memory is also adapted to make embedded memories because of the simplicity of the method for integrating these memories.

Document of S. Kianian et al., "A novel 3 volts-only, small sector erase, high density flash $E^2PROM$", Technical Digest of VLSI Technology, 1994, p. 71, describes another type of memory, called "split-gate" memory, which includes within a same memory cell, a storage transistor and a selecting transistor (or control transistor) formed on a single active area. Such a dual gate memory cell is generally programmed by injecting carriers through the source (called "source side injection"), a mechanism which actually requires the presence of a selecting transistor adjoining the storage transistor, and which enables the programming rate to be increased while reducing the consumption with respect to a NROM type memory.

In order to benefit from the advantages of each structure, whether split-gate or NROM type, US 2004/207025 A1 provides another dual gate memory type combining the structure of NROM type memory and a split-gate architecture. One of the difficulties for making these memories resides in controlling the position of gates (control gate and storage gate) with respect to one another.

Indeed, these gates are made by two consecutive photolithographies, the misalignment of the second gate with respect to the first gate setting the length of the second gate. A bad control of the relative positions of both gates thus results in a bad control in the electrical characteristics of the second transistor, and thus a bad performance of the memory. Accordingly, a very accurate control of the gates position is necessary upon making this kind of memory.

In order to get rid of this alignment constraint, U.S. Pat. No. 7,130,223 B2 suggests to make a dual gate memory combining the structure of an NROM type memory with a split-gate architecture wherein the storage gate, that is the gate including the data storage layer, is made as a lateral spacer of the control gate, provided against one of two lateral flanks of the control gate. Such a structure enables to accurately control the position and the dimension of the storage gate with respect to the control gate because, since the storage gate is made as a lateral spacer, it is thus self-aligned with the control gate.

However, with such a structure, it is very difficult to perform afterwards an electrical recontacting on the storage gate in view of the low dimensions of this gate as a natural spacer. Furthermore, because of the proximity of the storage gate with the control gate, there is a very high risk that the electrical contact made on the gate as a spacer creates a short circuit between both gates in case of misalignment upon making the electrical contact.

DESCRIPTION OF THE INVENTION

Thus there is a need to provide a new dual gate electronic memory cell enabling to make an electrical recontacting of each gate without any risk of short circuit between the gates, which does not require a very accurate alignment of electrical contacts with respect to the gates of the memory cells, and this without having to implement a further photolithography level dedicated to this electrical recontacting.

For this, it is proposed an electronic memory cell including at least:
an active area formed in a semi-conductor layer and including a channel provided between a source and a drain,
a first gate provided at least on a first part of the channel,
at least one portion of a first lateral spacer provided against at least one lateral flank of the first gate, a part of which forms a second gate provided on at least one second part of the channel,
one of the first or the second gate further including a stack of layers, of which at least one of said layers is capable of storing electrical charges,
the memory cell further including at least one portion of a second lateral spacer provided against at least one lateral flank of a block provided on the semi-conductor layer, the second lateral spacer being in contact with the first lateral spacer, the first and second lateral spacers being composed of similar materials, said portion of the second lateral spacer forming at least one part of an electrical contact pad electrically connected to the second gate.

Such an electronic memory cell thus proposes to make an electrical contact pad electrically connected to the second gate from two lateral spacers made with the same materials forming the second gate, except for the gate dielectric which is only present at the channel. Thus, the electrical continuity between the second gate and the electrical contact pad is ensured. Furthermore, taking into account that the electrical contact pad is formed by two lateral spacers contacting each other, the area for making the electrical recontacting is higher than the surface for the single second gate formed by the first lateral spacer.

The block against which is disposed the second lateral spacer is distinct from the first gate. This block is also distinct from the second gate. In addition, the block is spaced from the first gate, that is does not form a continuous portion of material(s) with the first gate. The block does not correspond to a portion of the first lateral spacer or the second lateral spacer, that is, the block is distinct from the first lateral spacer and the second lateral spacer.

The electrical contact pad may therefore correspond to two portions of different lateral spacers placed opposite one each another, for example in contact with each other.

Because the electrical contact pad made as two lateral spacers is formed from the same materials forming the second gate, this electrical contact pad can thus be made without requiring implementing a photolithography step dedicated to the making thereof.

The portion of the first lateral spacer may be rectilinear. Thus, the second gate can be provided along a single lateral flank of the first gate.

In another alternative, the portion of the first lateral spacer may be provided against two lateral flanks of the first gate which are distinct and perpendicular to each other. In this case, the electrical contact pad can be partly formed by a portion of the first lateral spacer provided against one of both lateral flanks which is substantially perpendicular to a source-drain direction.

The block may be formed by materials similar to those forming one part of the first gate. Thus, the block and the first gate can be made during common technological steps.

The layer capable of storing electrical charges of said stack of layers may be provided between two layers of dielectric material of said stack. Such a stack may be, for example, of the ONO (oxide-nitride-oxide) type.

When the second gate includes said stack of layers, the second lateral spacer may be formed by a part of the layers of said stacks.

The electrical contact pad may be partly formed by the portion of the first spacer.

The electronic memory cell may further include at least one portion of a third lateral spacer provided against at least one lateral flank of a second block and in contact with the second lateral spacer, and wherein the first, second and third lateral spacers may be composed of similar materials, wherein the electrical contact pad may be partly formed by the portion of the third lateral spacer.

Furthermore, the electronic memory cell may further include at least one portion of several other lateral spacers provided against at least one lateral flank of several other blocks and in contact with the second lateral spacer and/or the third lateral spacer and/or one of said other lateral spacers, and wherein the different lateral spacers may be composed of similar materials, wherein the electrical contact pad being formed by at least one part of the portions of said other lateral spacers. The number of blocks and/or the dimensions of blocks may be selected according to the desired directions of the electrical contact pad.

The first and the second blocks may be aligned with each other along a direction perpendicular to a source-drain direction.

The first lateral spacer may be provided against all the lateral flanks of the first gate and/or the second lateral spacer may be provided against all the lateral flanks of the blocks and/or, when the electrical contact pad is formed by the second and a third lateral spacers, the third lateral spacer may be provided against all the lateral flanks of the second block and/or, when the electrical contact pad is formed by at least one part of the portions of said other lateral spacers, said other lateral spacers may be provided against all the lateral flanks of said other blocks.

It is also proposed a method for making an electronic memory cell including at least the steps of:

making, in a semi-conductor layer an active area including a channel provided between a source and a drain, making a first gate provided at least on one first part of the channel, and at least one block provided on the semi-conductor layer, depositing a plurality of material layers for forming at least one second gate on at least one second part of the channel, said material layers covering at least the semi-conductor layer, the active area, the first gate and the block, anisotropically etching said material layers such that a first remaining portion of said material layers forms a first lateral spacer provided against lateral flanks of the first gate, a part of the first lateral spacer forming the second gate, and such that a second remaining portion of said material layers forms a second lateral spacer provided against lateral flanks of the block and in contact with the first lateral spacer, a portion of the second lateral spacer forming at least one part of an electrical contact pad electrically connected to the second gate, one the first and the second gates including a stack of layers, of which at least one of said layers is capable of storing electrical charges.

The plurality of material layers for forming the second gate may comprise at least one electrically conducting layer provided on at least one dielectric layer.

The block and the first gate may be made from the same material layers.

Upon making the first gate, a second block may also be made on a semi-conductor layer, wherein the anisotropically etching step may also form a third lateral spacer provided against lateral flanks of the second block, at least one portion of the third lateral spacer may be in contact with the second lateral spacer and forming at least one part of the electrical contact pad.

Upon making the first gate, several other blocks may also be made on the semi-conductor layer, and wherein the anisotropically etching step may also form several other lateral spacers provided against lateral flanks of said other blocks, at least one portion of said other lateral spacers may be in contact with the second lateral spacer and/or the third lateral spacer and/or one of said other lateral spacers, wherein the electrical contact pad may be formed by at least one part of the portions of said other lateral spacers.

The method may further include, after the anisotropically etching of said material layers, the implementation of a photolithography and an etching of the first and/or second and/or third lateral spacer and/or said other lateral spacers, such that remaining portions of the first and/or second and/or third lateral spacer and/or said other lateral spacers may form the second gate and the electrical contact pad.

When the second gate includes said stack of layers, the second lateral spacer may be formed by a part of the layers of said stack.

It is also proposed a memory device including a plurality of memory cells such as described above and provided as an array, or matrix, and electrically connected to each other according to a NOR type architecture.

The second lateral spacers of two adjacent memory cells may be provided against two opposed lateral flanks of a block common to both adjacent memory cells.

In another alternative, when the electrical contact pads of two adjacent memory cells are formed by second and third lateral spacers, said third lateral spacers may be provided against two opposed lateral flanks of a second block common to both adjacent memory cells.

Finally, it is also proposed a method for making a memory device including at least the steps of:

making a plurality of memory cells provided in an array, or matrix, including, for making at least one memory cell of each column of the array, implementing a making method according to the above description, making electrical interconnections of the plurality of memory cells such that the memory cells are electrically connected between each other according to a NOR type architecture.

BRIEF DESCRIPTION OF THE DRAWINGS

The present invention will be better understood upon reading exemplary embodiments given only for indication purposes and in no way limited by reference to the appended drawings wherein:

FIGS. 5 to 12B represent memory devices made according to different alternative embodiments.

Identical, similar or equivalent parts of the different figures described hereafter have the same reference numerals so as to make it easier to switch from one figure to the other.

Different parts represented on the figures are not drawn necessarily to an uniform scale, for the figures to be more intelligible.

Different possibilities (alternatives and embodiments) should be understood as being not exclusive from each other and can be combined between each other.

DETAILED DESCRIPTION OF PARTICULAR EMBODIMENTS

Figure 1A:
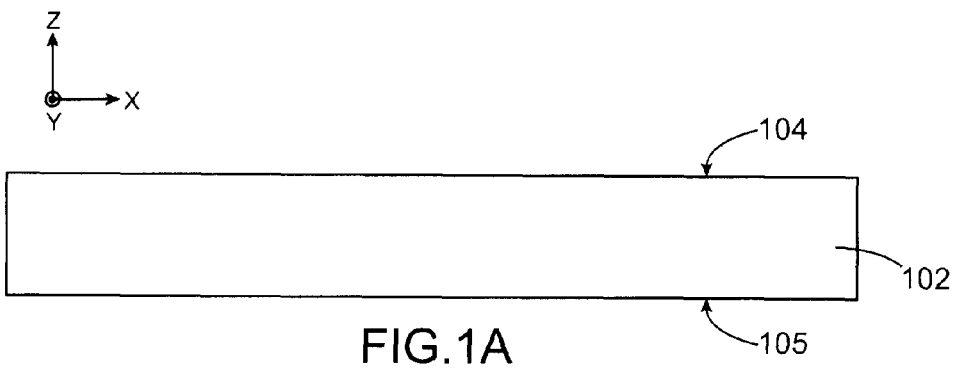
FIGS. 1A to 1O represent steps of a method for making a memory cell according to a first embodiment.
Figure 1B:
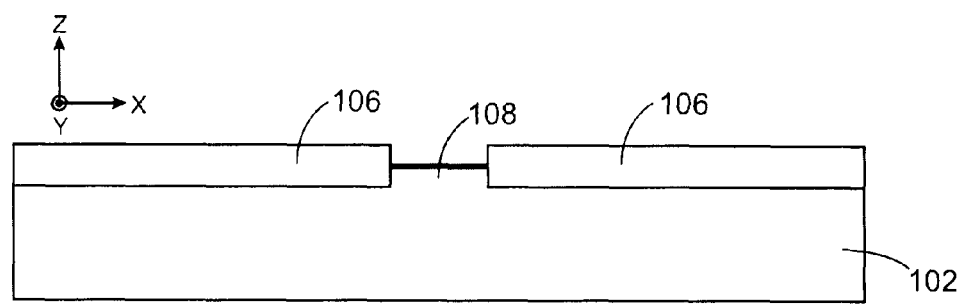
Figure 1C:
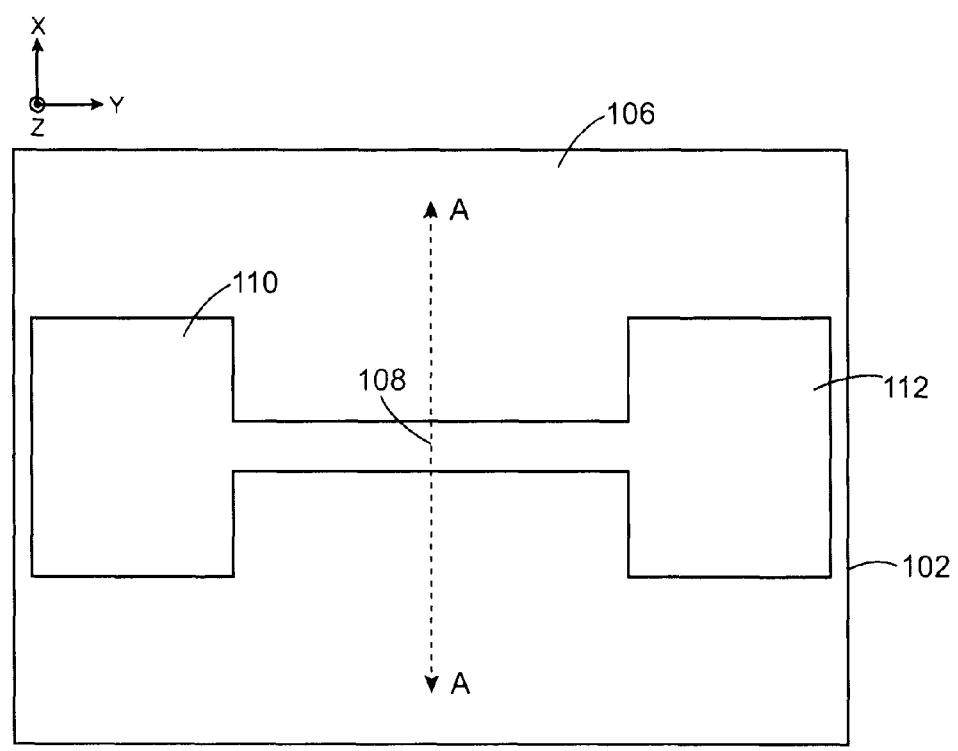
Figure 1D:
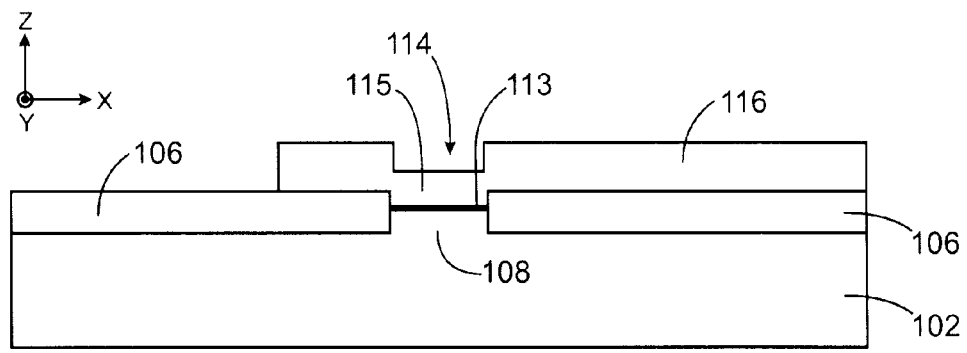
Figure 1E:
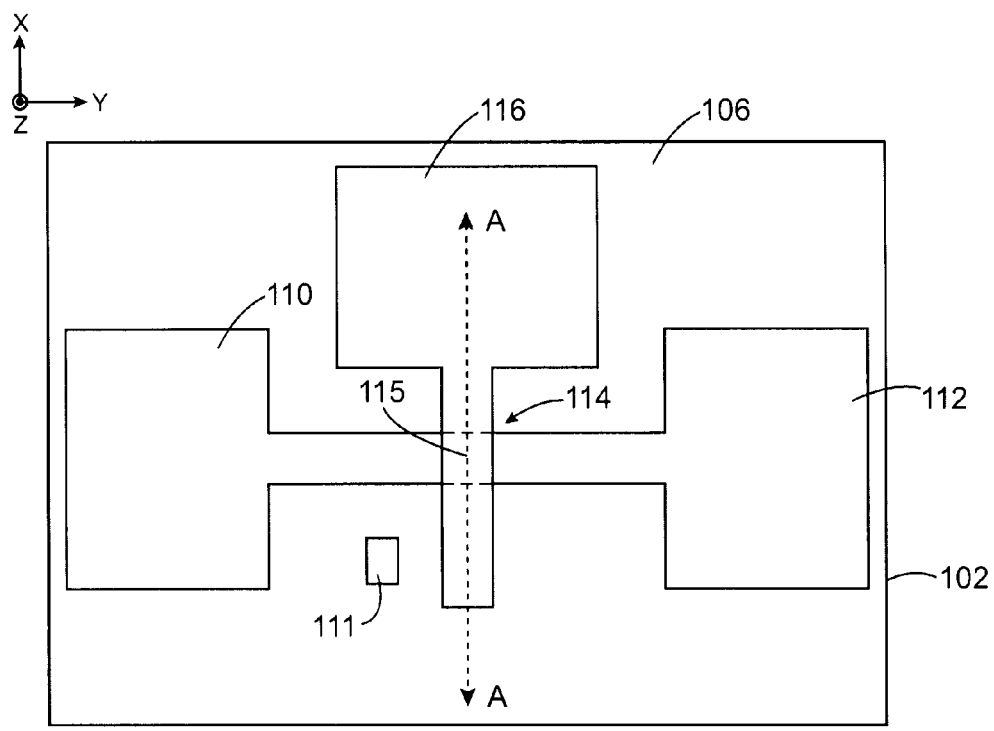
Figure 1F:
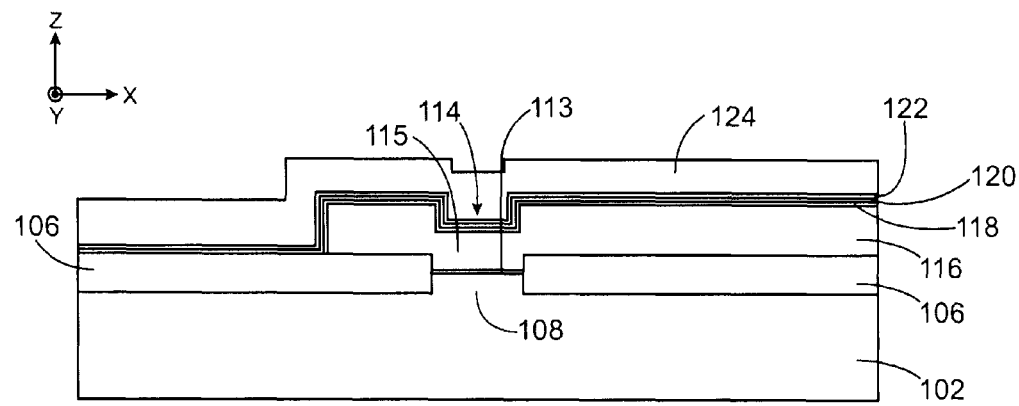
Figure 1G:
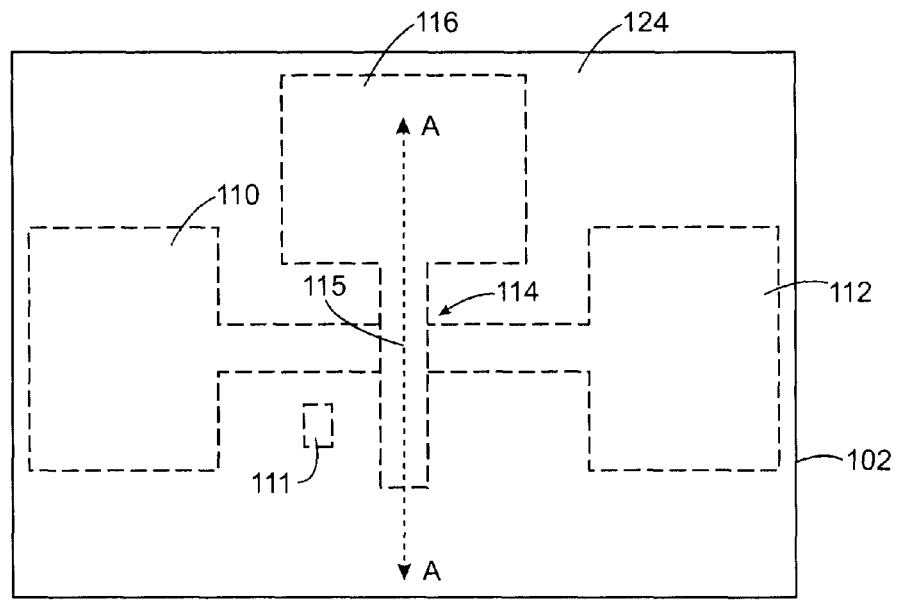
Figure 1K:
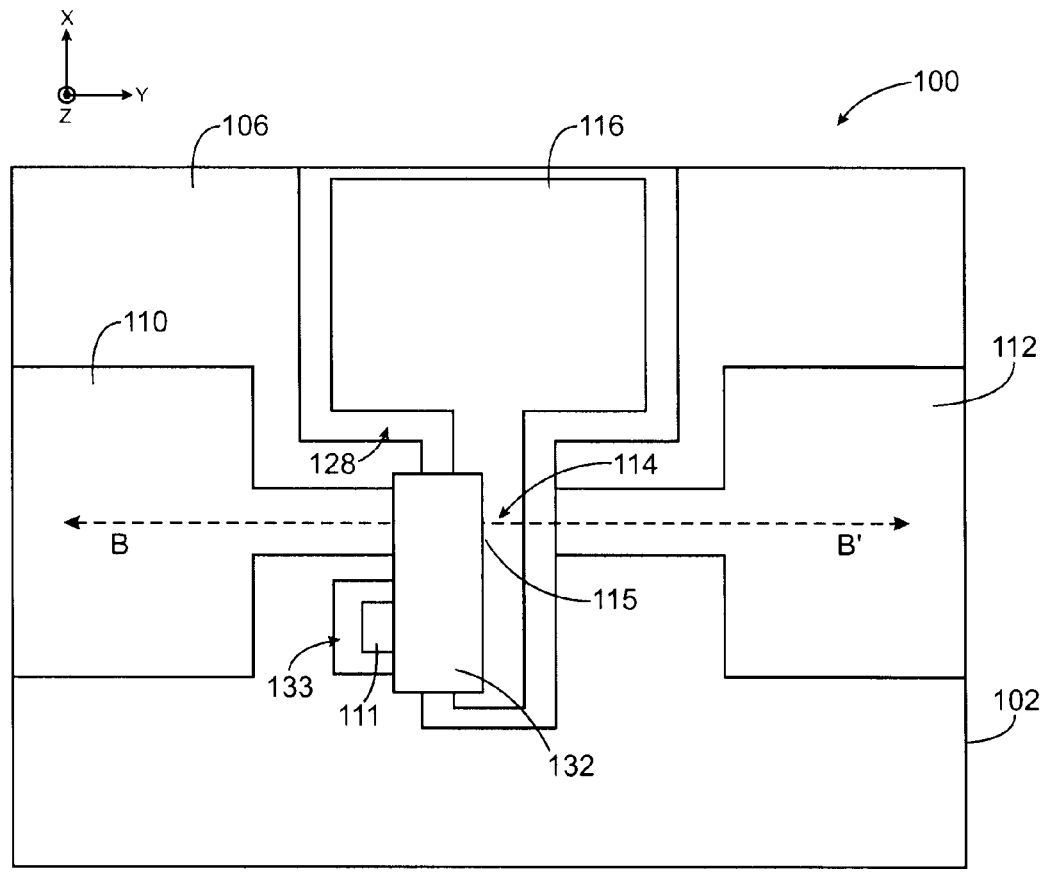
Figure 1L:
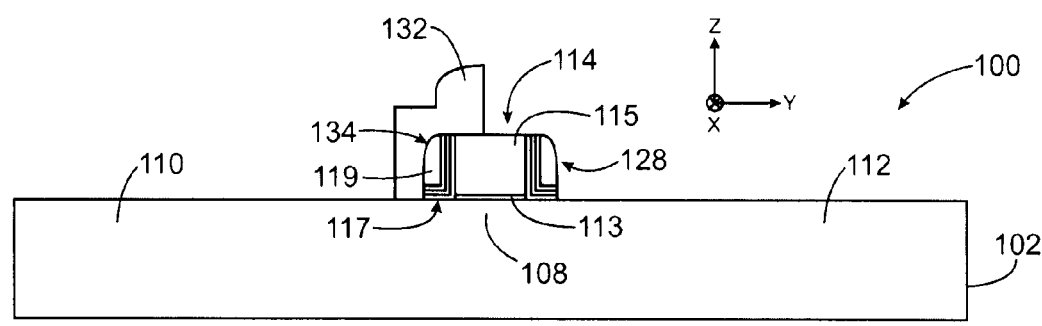
Figure 1M:
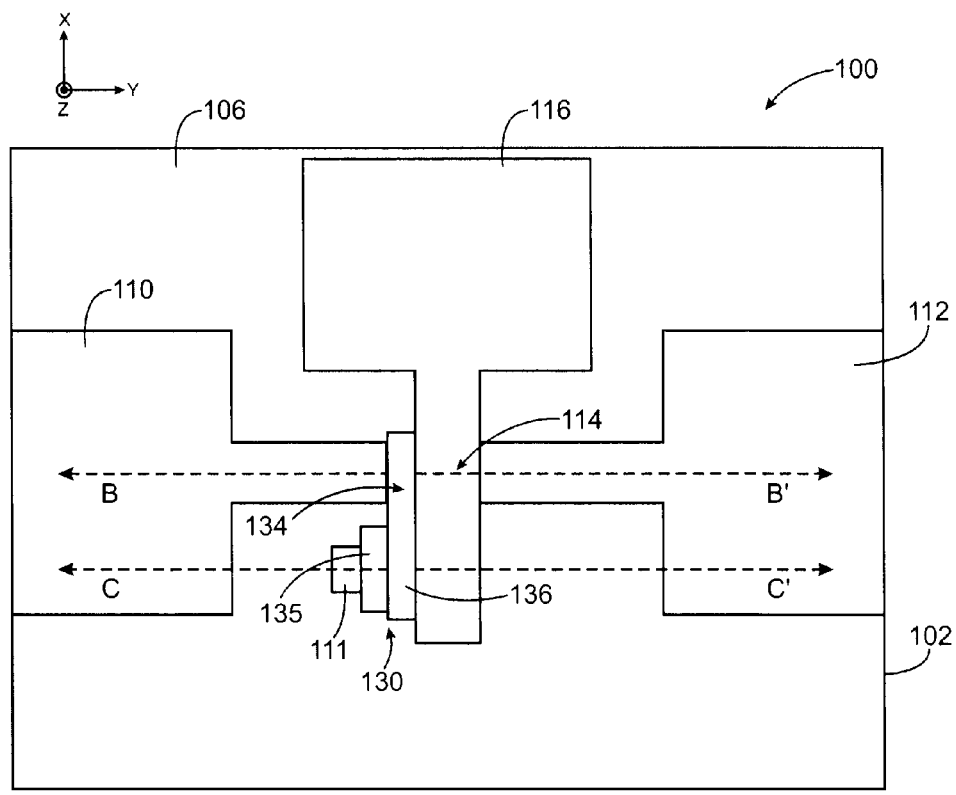
Figure 1N:
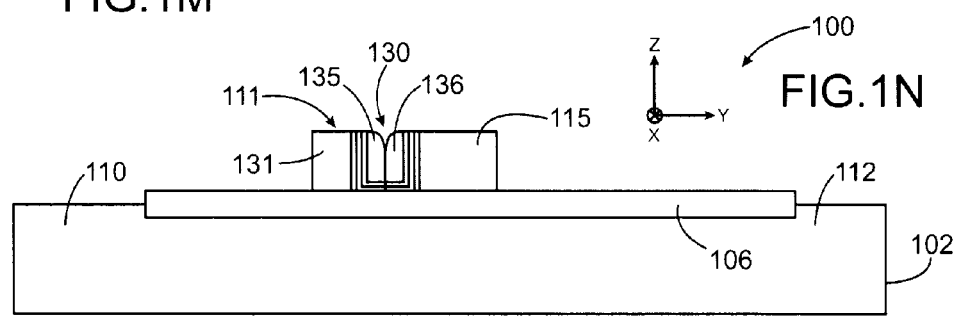
Figure 1O:
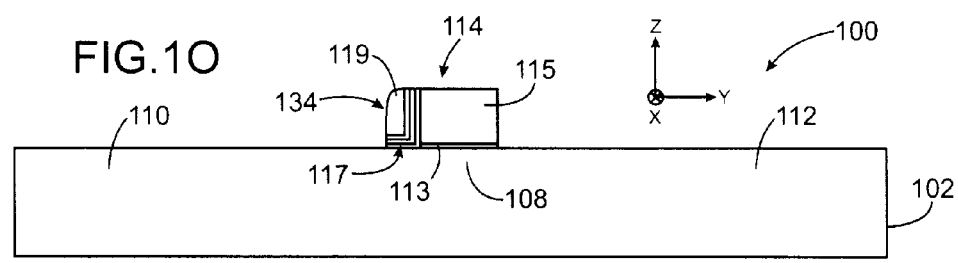

First, FIGS. 1A to 1O which represent steps of a method for making a memory cell 100 according to a first embodiment will be referred to.

As represented in FIG. 1A, the memory cell 100 is made from a substrate 102, for example composed of a semi-conductor such as silicon, including a main front face 104 and a main back face 105.

An active area of the memory cell 100 is first bounded in the substrate 102 by making isolation trenches, for example of the STI ("Shallow Trench Isolation") type, formed in the substrate 102, from the front face 104, and then filled with a dielectric material, thus bounding the active area of an isolation area 106 (see FIGS. 1B and 1C, FIG. 1B being a cross-section view along an axis AA represented in FIG. 1C). The active area includes three regions 108, 110 and 112, for forming a channel, a source and a drain respectively, of the memory cell 100.

Then a first of two gates of the memory cell which will be used thereafter for making the other gate as a lateral spacer is made. In the first embodiment described herein, this first gate corresponds to the control gate of the memory cell 100.

For this, a layer of dielectric material, for example silicon oxide, is formed, for example by thermal oxidation, on the active area. The thickness of this layer of dielectric material depends on the technological node of the memory cell 100, and is for example between about 1 nm and 10 nm. Then, a deposition of an electrically conducting layer composed of an electrically conducting gate material is performed, for example of n+ doped polysilicon with a thickness (dimension along the axis z represented in FIGS. 1D and 1E) equal to about 50 nm and conformally deposited on the dielectric layer previously formed and on the isolation area 106.

A photolithography and an etching of the gate material layer and the dielectric layer are then implemented in order to form a first gate 114 including a portion 115 of the gate material covering a gate dielectric 113 provided on a first part of the channel 108 and for forming the control gate of the memory cell 100 (FIGS. 1D and 1E). These photolithography and etching are also performed such that the first gate 114 can include an electrical contact pad 116 composed of a gate material, and with higher dimensions (in the plane X,Y)) than that of the portion 115, and which will be used as a surface for an electrical recontacting of the first gate 114. However, it is possible not to form this electrical contact pad 116, in which case the electrical recontacting is directly performed on a portion 115, or else to form an electrical contact pad 116 the dimensions of which correspond to those of the portions 115, thus forming an extension of the portion 115 at the isolation area 106.

These photolithography and etching steps also form, in the vicinity of the first gate 114, a block 111 provided on the isolation area 106. This block 111 is formed by a portion of the etched gate material layer. This block 111 will be then used for making an electrical contact pad 130 of the second gate 134.

Then, steps are implemented in order to make a second gate 134 for being provided on a second part of the channel 108 and for forming a storage gate of the memory cell 100, and make an electrical contact pad 130 of this second gate 134.

For this, first, a first layer 118 composed of a dielectric material, for example silicon oxide, is made, for forming a tunnel oxide of the second gate 134. This first layer 118 is conformally made on the active area, on the first gate 114 and on the block 111, for example by thermal oxidation. This first dielectric layer 118 is covered with a second layer 120 composed of a material capable of storing electrical charges and for forming the storage layer. This second layer 120, for example composed of silicon nitride, is also conformally made on the first dielectric layer 118, for example by implementing a CVD (chemical vapour deposition), and on the isolation area 106. The second layer 120 is then covered with a third layer 122 composed of a dielectric material for example silicon oxide. This third dielectric layer 122 is also conformally made on the second layer 120, for example by low pressure CVD and thermal oxidation. Finally, the third dielectric layer 122 is covered with a layer 124 composed of an electrically conducting gate material, for example n+ doped polysilicon, and for example with a thickness (dimension along the axis z) equal to about 50 nm. This layer 124 is also conformally deposited on the third dielectric layer 122 (FIGS. 1F and 1G). The first dielectric layer 118 has for example a thickness between about 4 nm and 8 nm, the second layer 120 has for example a thickness between about 4 nm and 10 nm, and the third layer 122 has for example a thickness between about 4 nm and 15 nm. In one alternative, it is possible not to make the third layer 122. In such a case, the thickness of the second layer 122 can be at least equal to about 10 nm.

The layers 118, 120, 122 and 124 previously made are then anisotropically etched, for example by a RIE (reactive ion etching) type dry etching, stopping on the active area, on the isolation area 106, on the first gate 114 and on the block 111. This etching step is implemented without making use of an etching mask and without subsequent over-edge steps. Because no over-edge steps is implemented, lateral spacers formed by remaining portions of each of the layers 118, 120, 122 and 124 are preserved around areas with a strong topography. Thus, a first lateral spacer 128 is formed around the first gate 114, against lateral flanks of the first gate 114 (see FIGS. 1H, 1I and 1J, FIGS. 1I and 1J being respectively cross-section views along axes BB and CC represented in FIGS. 1H). Moreover, since each of the etched layers has been conformally deposited, each of the remaining portions of these layers of the first lateral spacer 128 has thus a part provided facing a lateral flank of the first gate 114 and another part provided facing the channel 108. Thus, the remaining portions of the layers 118, 120 and 122 provided facing the lateral flanks of the first gate 114 provide the electrical isolation between the gate material of the first gate 114 and the remaining portion of the gate material layer 124 of the first spacer.

A portion of the first spacer 128 located above the channel 108 forms the second gate 134. The storage function of the second gate 134 will be provided by the remaining portions of the layers 118, 120 and 122 located above the channel 108, forming a memory stack 117. The memory stack 117 is covered with a remaining portion 119 of the electrically conducting layer 124.

This etching step also forms around the pad 111 which, as represented in FIG. 1J, is formed by a portion 131 of the gate material of the first gate 114, a second spacer 133 formed of the same materials as the first spacer 128.

The distance between the block 111 and the first gate 114 is selected so that the first spacer 128 and the second spacer 133 are in contact with each other (physically and electrically). Thus, the portions of the spacers 128 and 133 in contact with each other form an electrical contact pad 130 for making an electrical recontacting of the second gate 134.

The width $l_e$ of the first spacer 128, at the first gate 134, is substantially equal to the sum of the thickness of the layers from which the first spacer 128 is made. The first spacer 128 has for example a width $l_e$ between about 20 nm and 150 nm. Moreover, the width $l_e$ of the first spacer 128 is substantially equal to the width of the second spacer 133. Depending on the desired width of the second gate 134, which corresponds to the width $l_e$ of the spacer 128, the thicknesses suitable for the layers 118, 120, 122 and 124 will be selected in order to result in a spacer 128 with the desired width. The width of the second gate 134 will be in particular calculated for example through a numerical calculus software from the width of the channel 108, the length of the first gate 114, the depth of implantations made, etc. The simulations can be performed with a TCAD simulation software, such as Silvaco or Synopsys.

Such a simulation is performed by first setting the technological node (and thus the gate lengths) and then by simulating the static characteristics of the transistors Id(Vg1) Id(Vg2) as a function of parameters of the transistors: thickness of the dielectric of the selecting transistor, doping of the channel of the selecting transistor, doping of the channel of the memory transistor, doping of the LDD extensions, doping of the source/drain. Thus, the values of threshold voltages are controlled and the effects of short channel and drain disturb are restricted. A dynamical study can also be conducted from Monte Carlo simulations, as described for example in document "Monte Carlo simulation of substrate enhanced electron injection in split-gate memory cells" by W. Stefanutti et al., IEEE Trans. On Elec. Dev., 53, 1, pages 89-96, 2006, in order to evaluate the impact of transistors parameters and gate lengths on the memory performance.

Photolithography and etching steps can then be implemented in order to remove some parts of the first spacer 128 and the second spacer 133, such that a part of a remaining portion of the first spacer 128 corresponds to the second gate 134, that is the storage gate of the memory cell 100, and another part of this remaining portion of the first spacer 128 is in contact with the second spacer 133. For this, an etching mask 132 covering the portions of spacers 128, 133 to be preserved (FIGS. 1K and 1L) is made. The mask 132 is made as a single continuous portion of material in order to ensure an electrical continuity between the remaining portions of the first spacer 128 and the second spacer 133, this continuity ensuring an electrical contact between the electrical contact pad 130 and the second gate 134.

After this etching, the mask 132 is removed, developing the electrical contact pad 130 formed by a remaining portion 135 of the second spacer 133 and a remaining part 136 of the first spacer 128, this remaining part 136 being electrically connected to the second gate 134 (FIGS. 1M, 1N and 1O, FIG. 1N being a cross-section view along the axis CC represented in FIG. 1M and FIG. 1O being a cross-section view along the axis BB represented in FIG. 1M).

It can be seen therefore that with respect to memory cells according to prior art, the area available for making an electrical recontacting of the second gate 134 (area formed by the electrical contact pad 130, that is the portions of the spacers 135 and 136) is increased twofold compared to a memory cell wherein the electrical recontacting is made only on a spacer forming a gate, and without requiring implementing a further photolithography step. The misalignment tolerance during the subsequent implementation of electrical contacting of the second gate 134 is thus released by a factor of 2.

Analogously to memory cells of prior art, the memory cell 100 is then completed by performing in particular, after etching the second gate, LDD implantations, depositing and etching spacers of dielectric materials, HDD implantations, siliciding the gates, depositing passivation oxide, photolithography and etching the electrical contacts, depositing contact materials, etc.

Even though in this first embodiment, the second gate 134 is provided on the left (see FIG. 1M) of the first gate 114 (that is on the source 110 side), it is quite possible for the second gate 134 to be formed by the part of the spacer 128 provided on the channel 108 on the right of the first gate 114 (that is on the drain 112 side). In this case, the block 111 can be made on the right side of the first gate 114 in order to form the electrical contact pad 130 on the same side as the second gate 134.

In the first embodiment previously described, the first gate 114 of the memory cell 100 forms the control gate, whereas the second gate 134 forms the storage gate of the memory cell 100. However, in a second embodiment, it is possible for the first gate 114 to form the storage gate of the memory cell 100 and for the second gate 134, which is made as a lateral spacer of the first gate 114, to form the control gate of the memory cell 100.

Figure 2A:
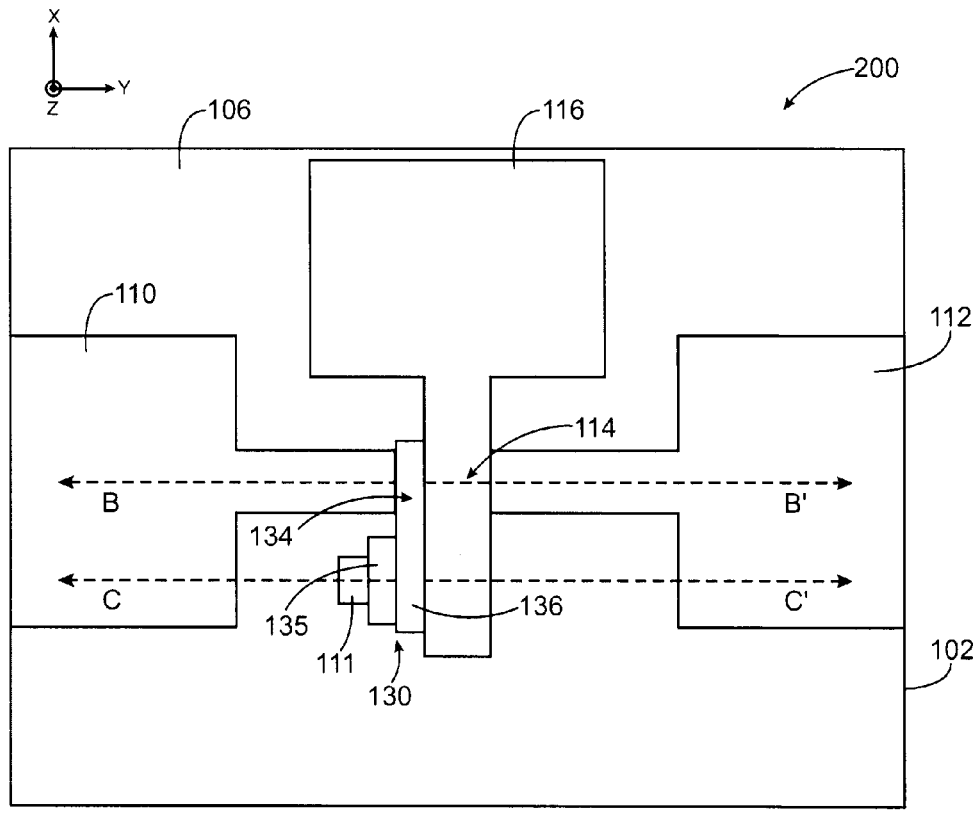
FIGS. 2A to 2C represent a memory cell according to a second embodiment.
Figure 2B:
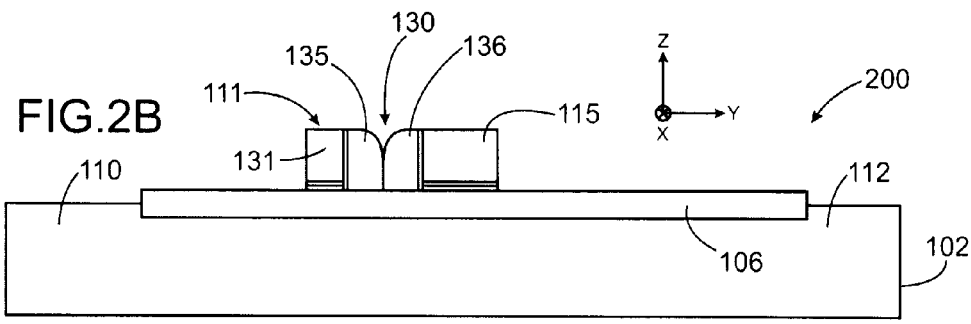
Figure 2C:
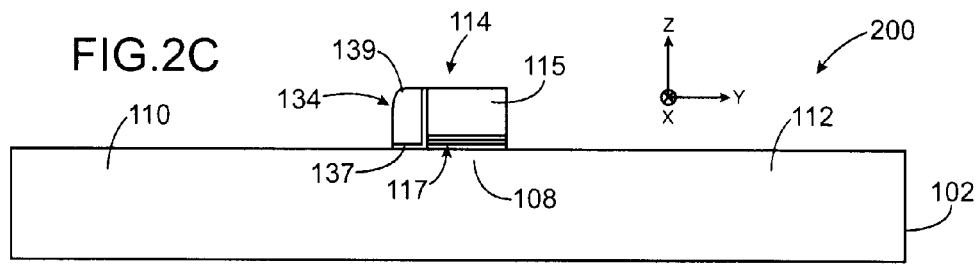

A memory cell 200 according to this second embodiment is represented in FIGS. 2A to 2C (FIGS. 2B and 2C representing cross-section views along the axes CC and BB represented in FIG. 2A respectively). As compared to the memory cell 100 previously described, the first gate 114 of this memory cell 200 forms the storage gate of the memory cell 200 whereas the second gate 134 forms the control gate of the memory cell 200.

This first gate 114 is thus made from a stack of layers, for example of a nature similar to the layers 118, 120, 122 and 124 used for making the second gate 134 of the memory cell 100. Thus, in this second embodiment, the first gate 114 does not include the gate dielectric 113 but a memory stack 117 formed by etched portions of the layers 118, 120 and 122 according to a pattern in accordance with that of the first gate 114 (this pattern being similar to that of the first gate 114 of the memory cell 100), this memory stack 117 being surmounted of the electrically conducting portion 115. A part of this memory stack 117 (that is all the portions of the stack 117 except for the portion of the layer 118) also lies under the portion of the electrically conducting material 115, at the isolation area 106, an at the block 111, under the portion of the gate material 131 since the block 111 is made from the same layers as those used for making the first gate 114.

In this second embodiment, as for the first embodiment, the second gate 134 forms a portion of a lateral spacer provided against a lateral flank of the first gate 114.

However, unlike the first embodiment, this second gate 134 does not include any memory stack (this being already formed at the first gate 114) but includes a gate dielectric 137 surmounted by a portion 139 of electrically conducting material, forming the control gate of the memory cell 200. These materials forming the second gate 134 are found in the elements forming the electrical contact pad 130, that is the portion of spacer 136 forming a continuous portion with the second gate 134, and the portion of spacer 135 provided against the block 111.

In one alternative embodiment of the memory cells 100 and 200, it is possible not to perform the photolithography and etching steps described in connection with FIGS. 1K to 1O. Indeed, it is quite possible to make an electrical recontacting of the second gate 134 from spacers 128 and 133 provided all around the first gate 114 and the block 111. Such a memory cell 100 corresponds to the memory cell represented in FIGS. 1H, 1I and 1J. In such a configuration, the data storage can be made in a single portion of the second gate 134, on either side of the first gate 114, the other portion being then used as an element of the access transistor, or in both portions of the spacer 128, on each side of the first gate 114. Such a configuration also enables to make a multibit memory with the provison that both lateral spacers wherein a storage can be made are independently contacted. If the spacers are connected to the same potential, particular writing modes can address each trapping layer of both lateral spacers.

Figure 3:
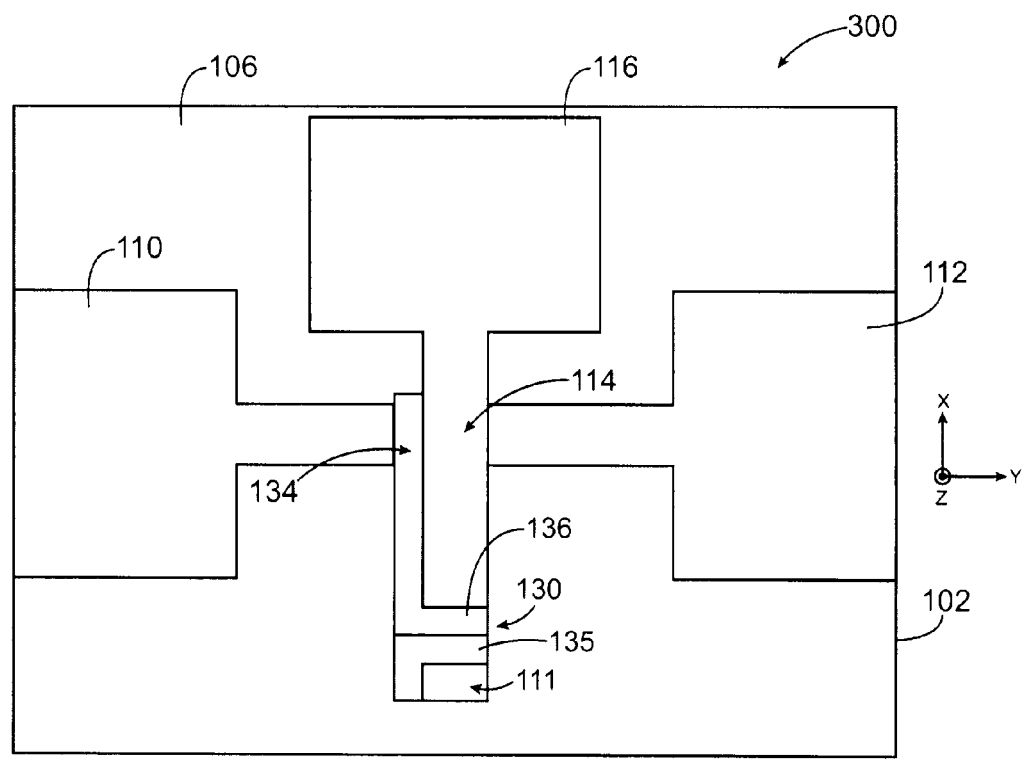
FIGS. 3, 4A and 4B represent a memory cell according to alternatives of the first and second embodiments.

Another alternative embodiment of a memory cell 300 is represented in FIG. 3.

In comparison to the memory cells 100, 200 previously described, the electrical contact pad 130 is herein made as an extension of the first gate 114.

Thus, the block 111 is provided as an extension of the first gate 114 along the axis x represented in FIG. 3. In this alternative, a remaining portion of the first lateral spacer, forming the second gate 134 as well as a portion 136 electrically connected to the second gate 134, is thus provided against two lateral flanks of the first gate 114 which are distinct and perpendicular to each other. The electrical contact pad 130 is herein formed by this portion of spacer 136 and the portion of spacer 135 formed against the pad 111, and is provided as an extension of the first gate 114 along the axis x represented in FIG. 3.

Such an alternative embodiment has in particular the advantage to be able to bring closer electrically conducting lines intended to be made for contacting the first gate 114 and the second gate 134, thus enabling to increase the density in a memory device formed of an array of memory cells 300. This alternative is applicable both to the memory cell 100 and the memory cell 200.

Figure 4A:
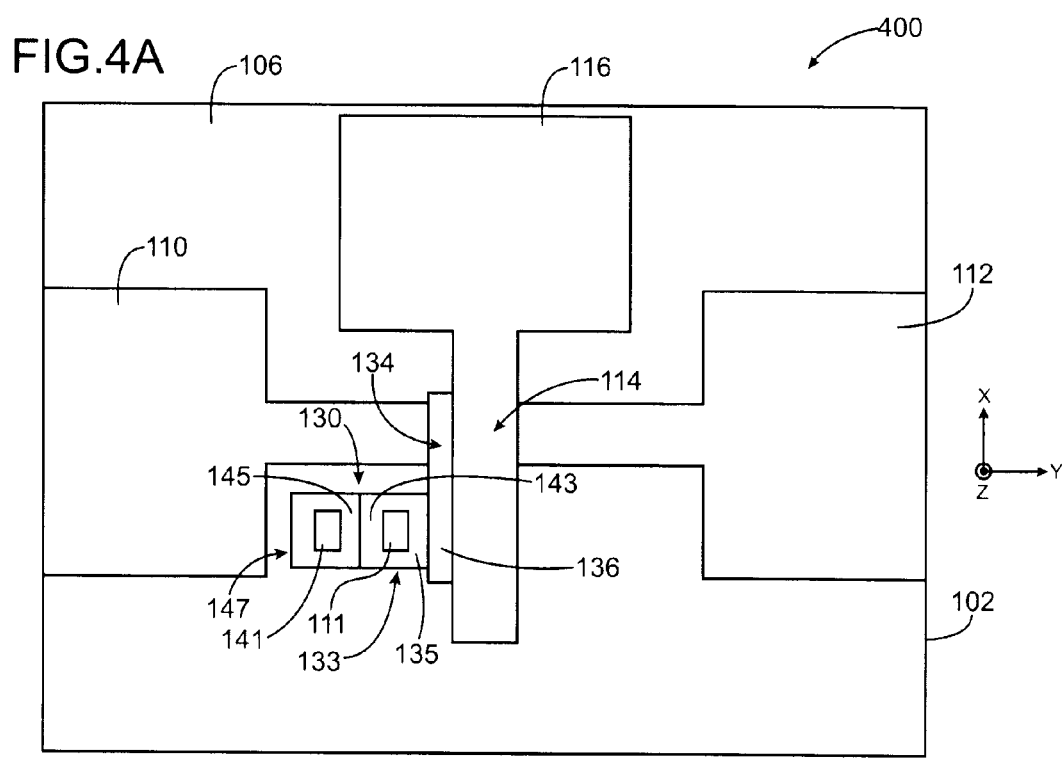

Another alternative embodiment of a memory cell 400 is represented in FIG. 4A.

In comparison with the memory cells 100 and 200 previously described, the portions of spacer 135 and 136 are not directly used as a surface for an electrical recontacting. Indeed, a second block 141, for example similar to the block 111, is made near the block 111, for example from layers used for making the first gate 114 and the first block 111. In the present case, the first block 111 and the second block 141 are aligned with one another along a direction parallel to the source-drain direction (parallel to the axis y). The distance between the blocks 111 and 141 is for example equal to the distance separating the block 111 from the first gate 114. In this alternative embodiment, the implementation of the anisotropic etching step forming the spacers 128 and 133 also forms a third spacer 147 around the second block 141. It can be seen in FIG. 4A that the second spacer 133 includes a portion 135 in contact with the portion of spacer 136 which is electrically connected to the second gate 134 and, against a lateral flank opposite to that against which the portion 135 lies, another portion 143 of this second spacer 133. Moreover, a portion 145 of the third spacer 147 formed around this second block 141 is in contact against the portion 143, these portions 143 and 145 forming the electrical contact pad 130, that is the surface for the electrical recontacting on which an electrical contact will be then made, this surface being electrically connected to the second gate 134 through the portions of spacer 135 and 136.

In comparison to the memory cells previously described, this memory cell 400 enables to eliminate the risk of a possible short circuit that can occur between the first gate 114 and the second gate 134 upon making the dielectric contact of the second gate 134 in case of a significant misalignment of the contact, because the blocks 111 and 141 are not in electrical contact with the first gate 114 and are far from the first gate 114.

Figure 4B:
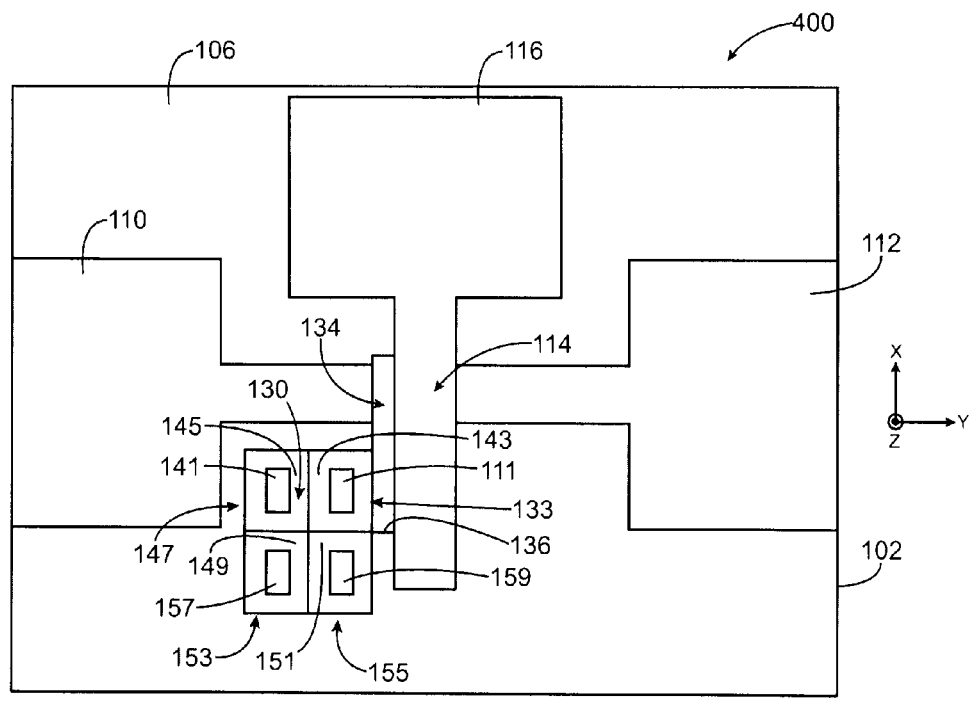

Another alternative embodiment of the memory cell 400 is represented in FIG. 4B.

In comparison to the memory cell 400 previously described in connection with FIG. 4A, the electrical contact pad 130 is formed by the portions 145 and 143 of the spacers 133 and 147, but also by the portions 149 and 151 of two other spacers 153 and 155 in contact with the spacers 133 and 147 and formed around two other blocks 157 and 159.

Generally, it is possible to form n blocks around which spacers will form a part of the electrical contact 130, with n being an integer equal to or higher than 1.

The memory cells 100 or 200 previously described are intended to be integrated in a great number as arrays, or matrix, to form Flash type memory devices. An example of a part of such a memory device 1000 is schematically represented in FIG. 5.

The memory device 1000 is formed by a plurality of memory cells 1002, some of which are similar to the memory cells 100 or 200 previously described, provided in array, that is in rows and columns. In FIG. 5, only 8 memory cells 1002.1 to 1002.8 are represented.

Figure 5:
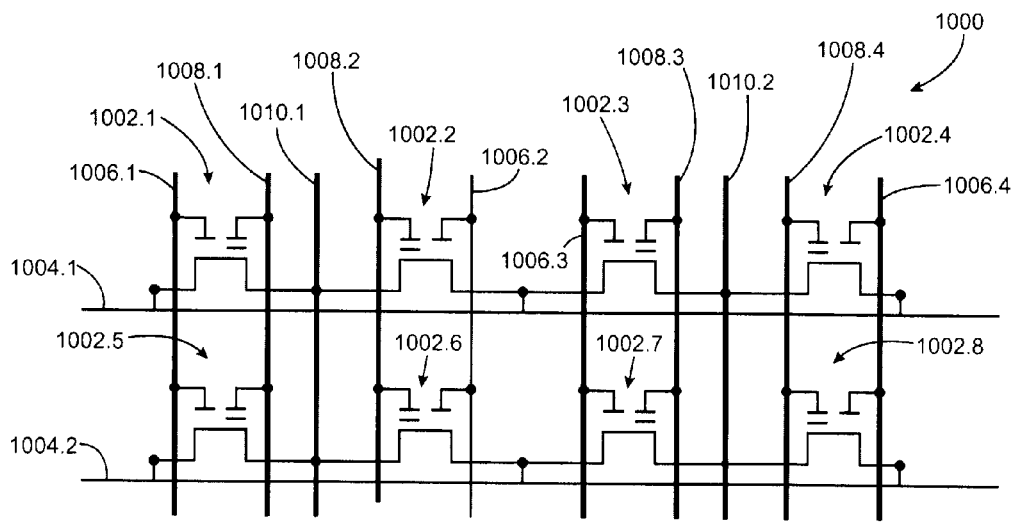

However, the memory device 1000 actually includes several thousand or million memory cells similar to the memory cells 1002.1-1002.8 and are all electrically connected between each other as represented in FIG. 5, as a single array or as several blocks. The 8 memory cells 1002.1-1002.8 can be seen as a "basic memory element" which is repeated several thousand or million times, both in rows and columns, to form the memory device 1000.

In the example of FIG. 5, the memory cells 1002 are electrically connected between each other in accordance with a NOR type (or NO-OR) architecture, that is wherein each memory cell 1002 of the array can be individually addressed.

In one alternative, it is contemplatable to make a NAND type architecture.

In this NOR type configuration, the drains of each memory cell 1002 of a same row are all connected to an electrically conducting line 1004, called a bit line, for addressing the memory cells located on this row. On the example of FIG. 5, the drains of the memory cells 1002.1 to 1002.4 are connected to a first bit line 1004.1. Likewise, the drains of the memory cells 1002.5 to 1002.8 are connected to a second bit line 1004.2.

The memory device 1000 also includes electrically conducting lines 1006, called word lines, each of the control gates of the memory cells of a same column being electrically connected to a same word line 1006.

Thus, in the example of FIG. 5, the control gates of the memory cells 1002.1 and 1002.5 are electrically connected to a first word line 1006.1. Likewise, the control gates of the memory cells 1002.2 and 1002.6, 1002.3 and 1002.7, and 1002.4 and 1002.8 are respectively connected to word lines 1006.2, 1006.3 and 1006.4.

In an analogous way, the storage gates of the memory cells of a same column are all electrically connected to an electrically conducting line called storage line. Thus, in the example of FIG. 5, the storage gates of the memory cells 1002.1 and 1002.5, 1002.2 and 1002.6, 1002.3 and 1002.7, and 1002.4 and 1002.8 are respectively connected to storage lines 1008.1, 1008.2, 1008.3 and 1008.4.

Finally, the memory 1000 also includes electrically conducting lines 1010, called source lines, electrically connected to the sources of memory cells of two adjacent columns.

Thus, the sources of the cells 1002.1, 1002.2, 1002.5 and 1002.6 are electrically connected to a first source line 1010.1, and the sources of the cells 1002.3, 1002.4, 1002.7 and 1002.8 are electrically connected to a second source line 1010.2

Figure 6:
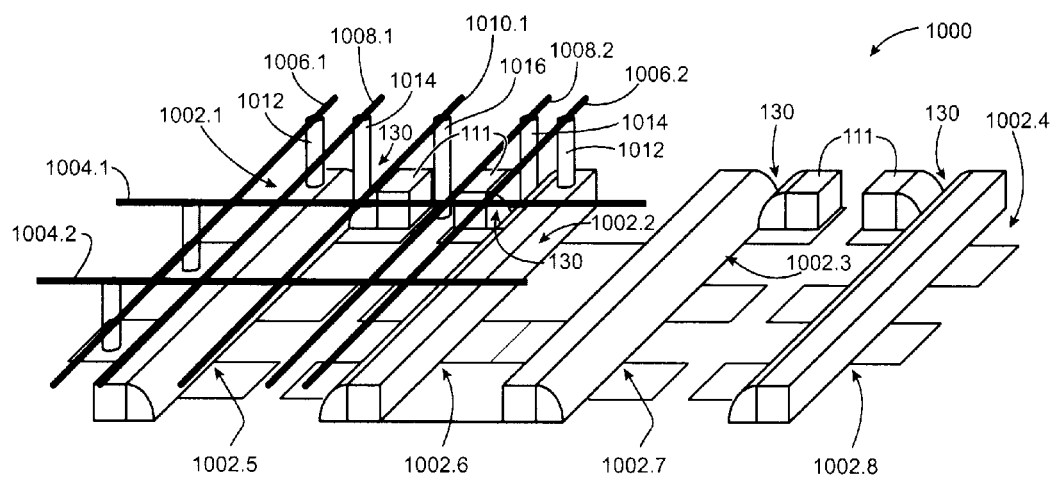

FIG. 6 is a simplified 3 dimension view of 8 memory cells 1002.1-1002.8 represented in FIG. 5. In this FIG. 6, only a part of electrical interconnection lines is represented. The memory cells 1002.1-1002.8 are herein substantially similar to the memory cell 100 previously described, that is include a storage gate forming a lateral spacer of the control gate. In the example of FIG. 6, it can also be seen that the gates (both the control gates and the storage gates) of cells provided on a same column are formed by continuous portions of materials for all the memory cells of the column. Thus, it is possible to make the memory cells of a same column such that a single one of these memory cells (for example the one located on top of the column, that is the memory cells 1002.1-1002.4 in the example of FIG. 6) includes an electrical contact pad (not represented in FIG. 4) enabling the word line 1006 to be electrically connected to the first control gate 114 of the memory cells of this column through an electrical contact 1012, and an electrical contact pad 130 enabling the storage line 1008 to be electrically connected to the second storage gates 134 of the memory cells of this column through an electrical contact 1014.

Moreover, in the example of FIG. 6, a single electrical contact 1016 connects sources of all the memory cells of two columns adjacent to the corresponding source line.

However, in an alternative embodiment, in order to reduce the resistances for accessing the sources, it is possible that several electrical contacts are made, for example one at each line of memory cells, to connect these sources to the source line 1010.

On the example of FIG. 6, bit lines 1004.1, 1004.2, forming electrically conducting lines extending horizontally, are made within a first metallization level, whereas the other electrically conducting line extending vertically (source lines, word lines and storage lines) are made within a second metallization level superimposed on the first metallization level. Moreover, making the electrical contacts is for example achieved by recovering the memory cells by a dielectric layer, and then by performing an etching of the locations of the electric contacts in the dielectric layer, and then by filling these locations with a metal, thus forming the electrical contacts. The electrically conducting lines are then made on this dielectric layer and superimposed between different levels of dielectric materials.

When a high density of memory cells 1002 is desired, it is possible to make the memory device 1000 in such away that the contacts 1012, 1014 and 1016 are offset and close to each other in order to minimize the space necessary for making these electrical contacts.

Moreover, it is also possible to widen the word lines 1006 and/or the storage lines 1008 and/or the source lines 1010 in order to facilitate the electrical recontacting on the memory cells 1002. Such a widening is defined upon the photolithography step, where a widened line is made instead of a uniform line.

Figure 7:
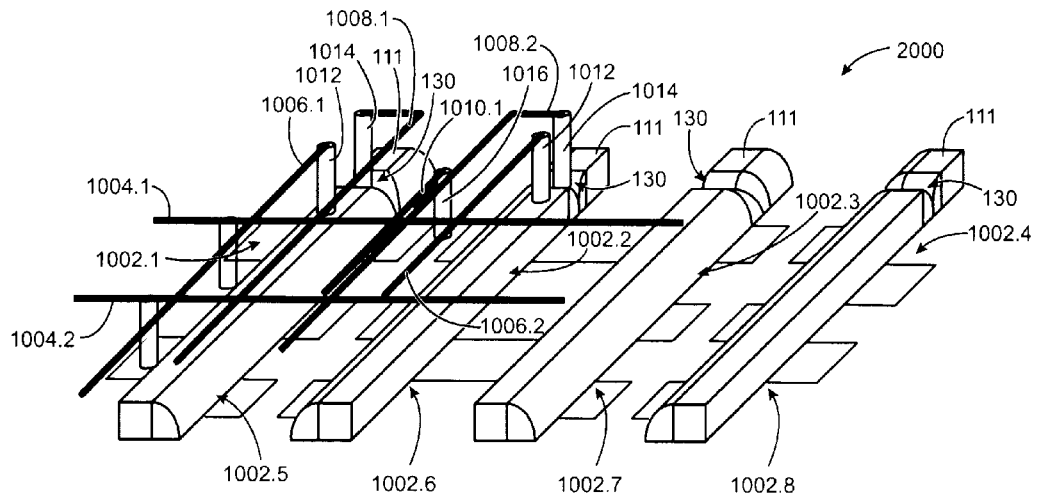

A memory device 2000 according to another embodiment is represented in FIG. 7. In comparison to the memory device 1000 previously described, the memory cells 1002 of this memory device 2000 are herein substantially similar to the memory cell 300 previously described in connection with FIG. 3, that is include an electrical contact pad 130 formed as an extension of the first gate 114. Thus, in comparison to the memory device 100, it is possible to bring closer the word lines 1006 and the storage lines 1008, and thus increase the integration density in the memory cell 1002 within the memory device 2000.

However, in order not to short circuit, within a column, the word line 1006 with the storage line 1008, the latter is laterally offset with respect to the word line 1006.

Once again, it is possible to widen the word lines 1006 and/or the storage lines 1008 and/or the source lines 1010 in order to facilitate the electrical recontacting on the memory cells 1002.

In another embodiment, it is possible to make memory cells of a memory device such that the portions of spacer 135 used to form the electrical contact pads 130 of two adjacent memory cells lie on the lateral flanks of a single block 111. Such a configuration is represented in FIGS. 8A and 8B, FIG. 8B being a cross-section view along the axis AA represented in FIG. 8A. In this example, the portions of spacer 135 of two adjacent memory cells lie on two opposite lateral flanks of the block 111 and are respectively in contact with the portions of spacers 136 lying on lateral flanks of two gates 114 of two adjacent memory cells, and form two electrical contact pads 130. This other embodiment enables the integration density in memory cells to be increase within a memory device.

In the example of FIGS. 8A and 8B, the block 111 is made on the isolation area 106 in order to prevent a cross-coupling between the block 111 and the substrate 102. However, it is quite possible to make the block 111 on a part of active area, as represented in FIGS. 9A and 9B. In this configuration, the block 111 is made such that its width is greater than that of the active area on which the block is provided. Thus, the portions 135 of spacers provided against the lateral flanks of the block 111 are prevented from being cross-coupled with the active area.

Figure 10:
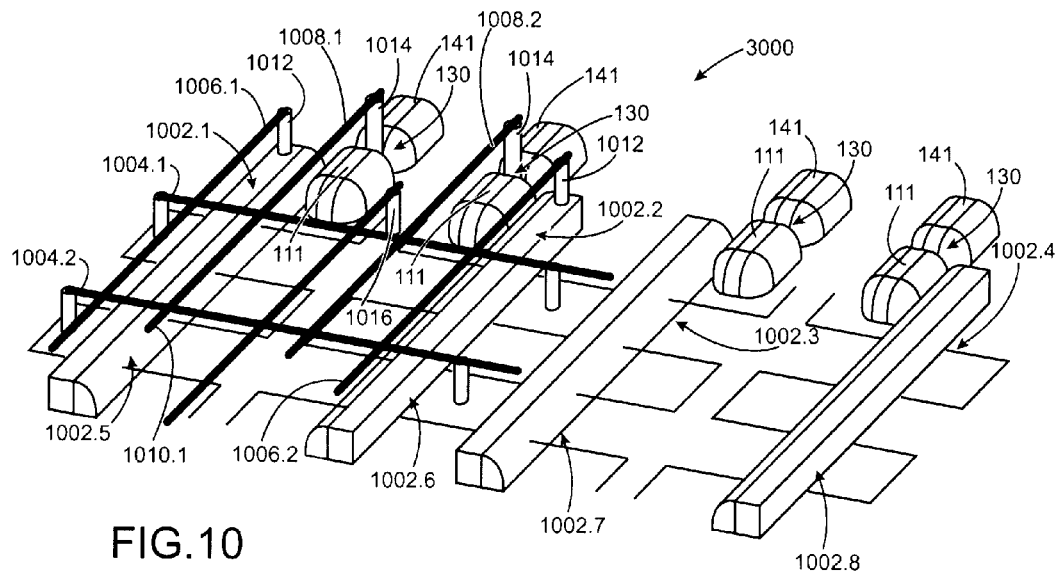

A memory device 3000 according to another embodiment is represented in FIG. 10. In comparison to the memory devices 1000 and 2000 previously described, the memory cells 1002 of this memory device 3000 are herein substantially similar to the memory cell 400 previously described in connection with FIG. 4, that is including an electrical contact pad 130 formed by portions of spacers provided against two blocks formed side by side, near the second gate 134. Such a configuration thus enables to make the electrical contacts 1014 without a risk of short circuit between the first and the second gates of a memory cell. In comparison to the memory cell 400 represented in FIG. 4, the blocks 111 and 141 of the memory cells 1002 are not aligned such that the first block 111 is provided between the second block 141 and the first gate 114. Indeed, in the memory cells 1002 represented in FIG. 10, both blocks 111 and 141 are aligned along a direction perpendicular to the direction of alignment of the blocks 111 and 141 of the memory cell 400, that is perpendicular to a source drain direction. This configuration of the memory cells 1002 enables, in comparison to the memory cell 400, to reduce the distance between the word lines 1006 and the storage lines 1008, thus enabling the integration density in the memory cells 1002 to be increased.

Once again, when a high density of memory cells 1002 is desired, it is possible to make a memory cell 3000 such that the contacts 1012, 1014 and 1016 are offset and close to each other in order to minimize the space necessary for making these electrical contacts. Moreover, it is also possible to widen the word lines 1006 and/or the storage lines 1008 and/or the source lines 1010 in order to facilitate the electrical recontacting on the memory cells 1002.

Figure 11:
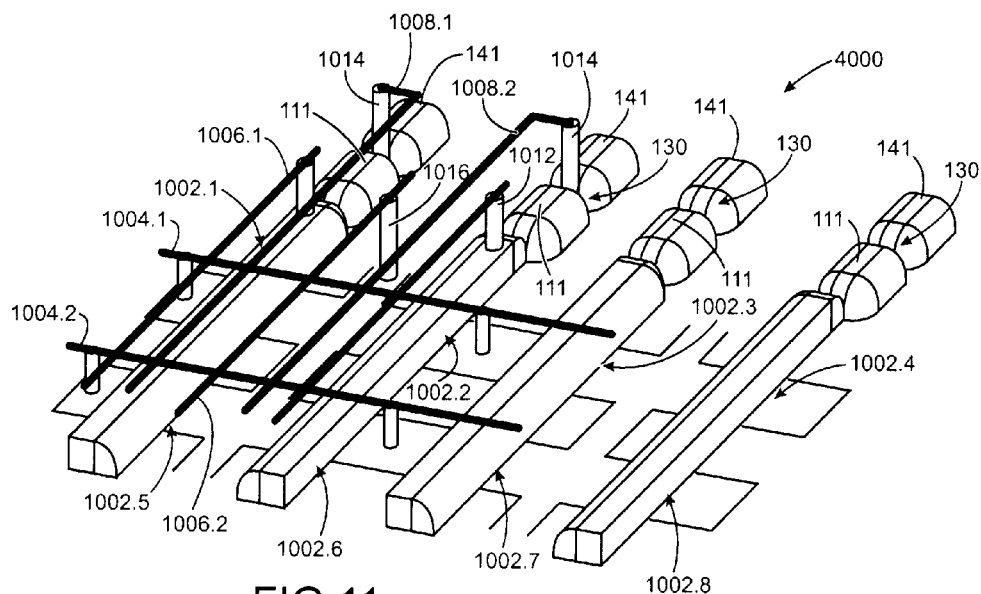

A memory device 400 according to another embodiment is represented in FIG. 11.

In comparison to the memory device 3000 previously described, the memory cells 1002 of this memory device 4000 include an electrical contact pad 130 formed by portions of spacers provided against two blocks 111 and 141 formed side by side, as an extension of the first gate 114. Thus, in comparison to the memory device 3000, it is possible to bring closer the word lines 1006 and the storage lines 1008, and thus to increase the integration density in the memory cells 1002 within the memory device 4000. However, in order not to short circuit, within a column, the word line 1006 with the storage line 1008, the latter is laterally offset with respect to the word line 1006.

Once again, it is possible to widen the word lines 1006 and/or the storage lines 1008 and/or the source lines 1010 in order to facilitate the electrical recontacting on the memory cells 1002.

In another embodiment, it is possible to make memory cells 1002 of a memory device 3000 or 4000 such that the portions of spacer 145 used to form the electrical contact pads 130 of two adjacent memory cells lie on the lateral flanks of a single block 141.

Such a configuration is represented in FIGS. 12A and 12B, FIG. 12B being a cross-section view along the axis AA represented in FIG. 12A. In this example, portions of spacer 145 lie on two opposite lateral flanks of the block 141 and are respectively in contact with portions of spacers 143 lying on lateral flanks of two blocks 111 of two adjacent memory cells, and form two electrical contact pads 130. This other embodiment enables the integration density in memory cells to be increased within a memory device.

In this example, the block 141 is made on the isolation area 106 in order to prevent a cross-coupling between the block 141 and the substrate 102.

However, as for the example previously described in connection with FIGS. 9A and 9B, the block 141 could be provided on a part of the active area. In this case, the block 141 would be made such that its width is greater than that of the active area on which the block 141 is provided, in order to prevent the portions 145.1 and 145.2 of spacers provided against the lateral flanks of the block 141 from being cross-coupled with the active area.

By way of indication, the values of voltages applied to different electrodes of such memory cells for different operations are given herein below:

|  | Vs (V) | Vd (V) | Vg1 (V) (Access Transistor) | Vg2 (V) (Memory Transistor) |
| --- | --- | --- | --- | --- |
| Writing Source Side Injection | 0.5 | 6 | 1 | 10 |
| Erasement Band to Band Tunneling | open | 6 | 0 | −6 |
| Reading | 1.5 | 0 | 1.5 | 1.5 |

The invention claimed is:

1. An electronic memory cell comprising:
   an active area formed in a semi-conductor layer and including a channel provided between a source and a drain;
   a first gate provided at least over a first part of the channel;
   a portion of a first lateral spacer being provided against at least one lateral flank of the first gate, a part of which forms a second gate and is provided over at least a second part of the channel;
   one of the first gate and the second gate including a stack of layers, at least one of said layers being capable of storing electrical charges; and
   a portion of a second lateral spacer provided against at least one lateral flank of a block, the block being distinct from the first gate and provided over the semi-conductor layer, the second lateral spacer being in contact with the first lateral spacer and does not extend over the active area in a plan view, the first and second lateral spacers being composed of the same material or materials, and said portion of the second lateral spacer forming at least one part of an electrical contact pad electrically connected to the second gate.

2. The electronic memory cell according to claim 1, wherein the portion of the first lateral spacer is rectilinear.

3. The electronic memory cell according to claim 1, wherein the portion of the first lateral spacer is provided against two lateral flanks of the first gate, including said at least one lateral flank, which are distinct and perpendicular to each other.

4. The electronic memory cell according to claim 1, wherein the block is formed by materials the same as those forming a part of the first gate.

5. The electronic memory cell according to claim 1, wherein said at least one layer capable of storing electrical charges is provided between two dielectric material layers of said stack.

6. The electronic memory cell according to claim 1, wherein, when the second gate includes said stack of layers, the second lateral spacer is formed by a part of the layers of said stack.

7. The electronic memory cell according to claim 1, wherein the electrical contact pad is partly formed by the portion of the first spacer.

8. The electronic memory cell according to claim 1, further comprising at least one portion of a third lateral spacer provided against at least one lateral flank of a second block and being in contact with the second lateral spacer,
   wherein the first, second and third lateral spacers are composed of the same material or materials, and the electrical contact pad being partly formed by the portion of the third lateral spacer.

9. The electronic memory cell according to claim 8, wherein the first and second blocks are aligned with respect to each other along a direction perpendicular to a source-drain direction.

10. The electronic memory cell according to claim 8, further comprising at least one portion of other lateral spacers provided against at least one lateral flank of corresponding other blocks and being in contact with at least one of the second lateral spacer, the third lateral spacer, and one of said other lateral spacers,
    wherein at least the second, third, and one of said other lateral spacers are composed of the same material or materials, and the electrical contact pad being formed by at least one part of the portions of said other lateral spacers.

11. The electronic memory cell according to claim 1, having one or more of the following:
    the first lateral spacer is provided against all lateral flanks of the first gate,
    the second lateral spacer is provided against all the lateral flanks of the block,
    when the electrical contact pad is partly formed by a portion of a third lateral spacer, the first, second and third lateral spacers are composed of a same material or materials, and the third lateral spacer being provided against all lateral flanks of a second block, and
    when the electrical contact pad is formed by at least one part of the portions of said other lateral spacers, said other lateral spacers are provided against all lateral flanks of said other blocks.

12. A memory device including a plurality of electronic memory cells according to claim 1, provided in an array and electrically connected with each other according to a NOR type architecture.

13. The memory device according to claim 12, wherein the second lateral spacers of two adjacent memory cells are provided against two opposite lateral flanks of the block, which is common to both adjacent memory cells.

14. The memory device according to claim 12, wherein, when the electrical contact pads of two adjacent memory cells are respectively formed by the second lateral spacer and a third lateral spacer, said third lateral spacers of the two adjacent memory cells are provided against two opposite lateral flanks of a second block common to both adjacent memory cells.

* * * * *